United States Patent [19]

Suzuki et al.

[11] Patent Number: 5,166,754
[45] Date of Patent: Nov. 24, 1992

[54] ALIGNMENT SYSTEM

[75] Inventors: Akiyoshi Suzuki, Tokyo; Tetsuya Mori, Yokohama, both of Japan

[73] Assignee: Canon Kabushiki Kaisha, Tokyo, Japan

[21] Appl. No.: 875,603

[22] Filed: Apr. 28, 1992

Related U.S. Application Data

[63] Continuation of Ser. No. 794,840, Nov. 21, 1991, abandoned, which is a continuation of Ser. No. 701,016, May 13, 1991, abandoned, which is a continuation of Ser. No. 587,171, Sep. 18, 1990, abandoned, which is a continuation of Ser. No. 504,036, Apr. 4, 1990, abandoned, which is a continuation of Ser. No. 214,489, Jul. 1, 1988, abandoned.

[30] Foreign Application Priority Data

Jul. 3, 1987 [JP] Japan .................. 62-16547

[51] Int. Cl.$^5$ .............................. G01B 11/00
[52] U.S. Cl. ........................ 356/401; 356/400
[58] Field of Search ................. 356/400, 401

[56] References Cited

U.S. PATENT DOCUMENTS

| | | | |
|---|---|---|---|
| 4,492,459 | 1/1985 | Omata | 356/401 |
| 4,545,683 | 10/1985 | Markle | 356/401 |
| 4,655,599 | 4/1987 | Ayata et al. | 356/401 |
| 4,669,883 | 6/1987 | Ina et al. | 356/402 |
| 4,679,942 | 7/1987 | Suwa et al. | 356/401 |
| 4,699,515 | 10/1987 | Tanimoto et al. | 356/401 |
| 4,728,193 | 3/1988 | Bartelt et al. | 356/401 |
| 4,794,426 | 12/1988 | Nishi | 356/400 |
| 4,795,261 | 1/1989 | Nakata et al. | 356/401 |
| 4,801,808 | 1/1989 | Hamasaki | 356/401 |

Primary Examiner—Léon Scott, Jr
Attorney, Agent, or Firm—Fitzpatrick, Cella, Harper & Scinto

[57] ABSTRACT

An alignment system for aligning a first object, having a first alignment mark, and a second object having a second alignment mark, disposed at a position which is approximately conjugate with the first object with respect to a projection optical system. The alignment system includes a detecting device for detecting light from the first and second alignment marks with light irradiated by light. The detecting device detects the light from the second alignment mark as passed through the projection optical system and the first objects. An adjusting device adjusts the spacing between the first object and the second object in the direction of an optical axis of the projection optical system. The adjusting device is arranged to change the optical path length for the light from the second alignment mark, between the first and second objects, by the adjustment of that spacing, control device controls the adjusting device. The detecting device can produce a first signal based on the light from the first and second alignment marks at a first distance, and a second signal based on the light from the first and second alignment marks at a second distance. The control device is operable to determine a positional deviation between the first and second objects on the basis of the first and second signals, and the relative position of the first and second objects can be adjusted to correct the positional deviation.

35 Claims, 1 Drawing Sheet

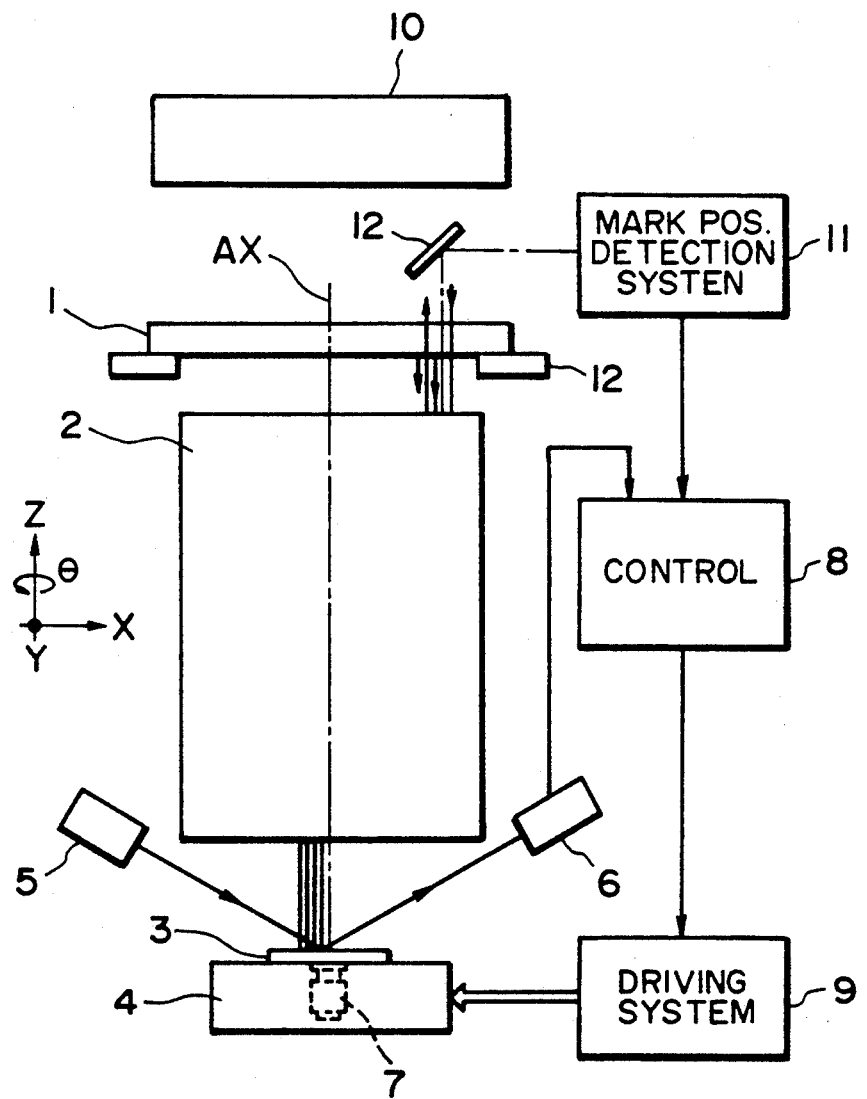

ALIGNMENT SYSTEM

This application is a continuation of application Ser. No. 07/794,840 filed Nov. 21, 1991, now abandoned, which was a continuation of application Ser. No. 07/701,016 filed May 13, 1991, now abandoned; which was a continuation of application Ser. No. 07/587,171 filed Sep. 18, 1990, now abandoned; which was a continuation of application Ser. No. 07/504,036 filed Apr. 4, 1990, now abandoned; which was a continuation of application Ser. No. 07/214,289 filed Jul. 1, 1988, now abandoned.

FIELD OF THE INVENTION AND RELATED ART

This invention relates to an alignment system for bringing two objects into a predetermined positional relation and, more particularly, to an alignment system usable in an exposure apparatus, for use in the manufacture of semiconductor microcircuits, for detecting alignment marks provided on a mask or reticle and a wafer and for bringing the mask or reticle and the wafer into a predetermined positional relation on the basis of the detected positional relationship between the marks.

In the field of exposure apparatuses for photoprinting a circuit pattern upon a semiconductor wafer, for the manufacture of semiconductor microcircuits, step-and-repeat type projection exposure apparatuses, each called a "stepper", are used prevalently in consideration of recent further miniaturization of circuit patterns and the increasing diameter of wafers. Many varieties of alignment systems have been proposed and developed with respect to the alignment process to be made in such exposure apparatuses, as may be representd by a stepper, for aligning an original such as a reticle with a member to be exposed, such as a wafer whose surface is coated with a resist material. Typical examples are disclosed in U.S. Pat. Nos. 4,251,129 and 4,406,546 both assigned to the same assignee of the subject application. According to these proposals, alignment marks formed on a reticle and a wafer are observed through an optical system and, on the basis of the observation, manipulation is made to bring these alignment marks into a predetermined positional relation to thereby align the reticle and the wafer with each other.

In the typical examples described above, a laser source which functions as an alignment light source, as well as photodetecting means are disposed on one side of a reticle which is remote from a projection optical system and a wafer, and the reticle and the wafer are scanned at a constant speed with the laser beam. Reflectively diffracted lights from the marks of the reticle and the wafer are received by the photo-detecting means, such that the positional relation between these marks and, therefore, any relative positional deviation between the reticle and the wafer, is detected.

SUMMARY OF THE INVENTION

The inventors of the subject application have found some inconveniences peculiar to the conventional alignment systems. One is multireflection of light which occurs between the reticle surface and the wafer surface. Particulars are as follows:

Upon the alignment operation, light passes through a reticle and is projected upon a wafer. The light is reflected by the wafer and the reflected light passes again through the reticle. At this time, a portion of the light is reflected by a glass surface of the reticle, so that there occurs a reflected light of about 4% in intensity, directed back to the wafer. Such reflected light impinges again on the wafer and is reflected thereby again. Such twice-reflected light goes back to the reticle and passes again through the reticle. Also, at this time, there occurs a reflected light of about 4% in intensity, directed back to the wafer. In this manner, in addition to the light reflected once by the wafer (hereinafter, such light will be referred to also as a "signal light W1"), which light is a signal light that should be actually detected, to detect the position of the alignment mark of the wafer, there occur multireflection lights such as a light reflected twice by the wafer (hereinafter, such light will be referred to as a "signal light W2"), a light reflected three times by the wafer (hereinafter, such light will be referred to as a "signal light W3") and so on. All of these lights are received by the photodetecting means. Hereinafter, the composition of such multireflected lights will be referred to as a "signal light $W_T$".

Since the reflected light from the wafer goes through a projection optical system to the photodetecting means, the precision of detection at the photodetecting means is affected by the aberration of the projection optical system. The multireflected lights described above are such lights as having passed through the projection optical system by plural times. Therefore, the aberration of the projection optical system has a large effect upon the multireflected lights. Accordingly, when the photodetecting means receives a light in which the signal light $W_T$ is superimposed upon the signal light W1, the detecting precision may be deteriorated.

Another problem is that, where a single-wavelength laser is used as an alignment light source, there is a possibility of interference between the reflected light from the wafer and the multireflected lights described above. The state of interference fringe upon a light-receiving surface of the photodetecting means, which a fringe is formed as a result of the interference, is determined by an optical path difference between the optical path concerning the signal light W1 and each of the optical paths concerning the signal lights W2, W3, W4, ..., and such optical path difference is determined by the distance between the reticle and the wafer in the direction of an optical axis of the projection optical system. Actually, such an optical path difference is variable due to the variation in temperature or pressure within a projection exposure apparatus or due to the effect of the flatness of a wafer used. More specifically, the optical path difference changes at different moments and/or at different sites of different shot areas on the wafer. As a result, the state of the interference fringe upon the photodetecting means changes accordingly.

The measured value concerning the position of an alignment mark on a wafer, namely the site of the wafer, is changeable with the change in the state of the interference fringe described above, such that the measured value includes inaccuracies within a certain range of variation. This is a bar to the attainment of the detection of the positional relation between a reticle and a wafer, at a currently required precision of an order not greater than 0.1 micron. Also, this makes it difficult to accurately align a reticle and a wafer with each other.

Accordingly, it is a primary object of the present invention to provide an alignment system by which a reticle or photomask and a wafer can be accurately aligned with each other.

Briefly, in accordance with an aspect of the present invention, to achieve the above object, there is provided an alignment system, comprising:

illumination means for illuminating, with a light beam, alignment marks provided on a photomask and a wafer;

light receiving means for receiving lights from the alignment marks and for producing signals corresponding to the positions of the alignment marks;

interval changing means for changing the interval between the photomask and the wafer, from a first interval to a second interval;

detecting means for detecting the positional relation between the alignment marks on the basis of the output signals produced from said light receiving means as the photomask and the wafer are spaced by the first interval and the second interval, respectively; and driving means for displacing at least one of the photomask and the wafer in accordance with the detection by said detecting means to thereby align the photomask and the wafer.

The interval changing means of the present invention is effective to change the optical path length of a light beam between the photomask and the wafer. Accordingly, when the alignment system of the present invention is incorporated into a projection exposure apparatus for projecting a circuit pattern of a photomask upon a wafer by use of a reduction projection lens system, the interval between the photomask and the wafer can be changed in any of various methods such as, for example, a method wherein a wafer stage is displaced in a direction of an optical axis of a projection lens system; a method wherein a photomask stage is displaced in a direction of an optical axis of a projection lens system; a method wherein at least one of lenses constituting a projection lens system is displaced in a direction of an optical axis of the projection lens system; and a method wherein the refracting power of an air lens between predetermined lenses of a projection lens system is changed.

These and other objects, features and advantages of the present invention will become more apparent upon a consideration of the following description of the preferred embodiments of the present invention taken in conjunction with the accompanying drawings.

BRIEF DESCRIPTION OF THE DRAWING

The attached drawing is a schematic and diagrammatic view showing a general arrangement of a projection exposure apparatus into which an alignment system according to one embodiment of the present invention is incorporated.

DESCRIPTION OF THE PREFERRED EMBODIMENTS

Referring to the drawing, there is shown an alignment system according to one embodiment of the present invention, which is incorporated into a projection exposure apparatus, called a "stepper".

In the drawing, denoted at 1 is a reticle (photomask) having formed thereon a circuit pattern (not shown) and alignment marks (not shown); at 2, a reduction projection lens system; and at 3, a wafer whose surface is coated with a resist material. When the circuit pattern formed on the reticle 1 is illuminatd by a photoprinting light supplied from an illumination system 10, the circuit pattern is projected by the projection lens system 3, having an optical axis AX, and is photoprinted on the wafer 3. Wafer stage 4 is adapted to hold the wafer 3 thereon and also is adapted to be moved, by a driving system 9, in each of an X-axis direction, a Y-axis direction, a Z-axis direction and a $\theta$ (rotational) direction, as illustrated. The position of the wafer stage 4 can be monitored by a well-known laser interferometer system, not shown.

The reticle 1 is held by a reticle stage 12 which is adapted to be displaced, by a driving system (not shown), in each of the X, Y and $\theta$ directions. The reticle stage 12 may be arranged to be moved also in the Z-axis direction, as desired. It will be appreciated that the X, Y and $\theta$ directions are contained in a plane perpendicular to the optical axis AX of the projection lens system, while the Z direction is parallel to the optical axis AX.

The projection lens system 3 used in the present embodiment provides an imaging system which is of a what is called "dual telecentric type" wherein it is telecentric both on the reticle 1 side (object side) and on the wafer 3 side (image side), and it forms in a reduced scale an image of a circuit pattern of the reticle 1 on the wafer 3.

The illumination system 10 comprises a well-known type light source such as, for example, an Xe-Hg lamp or an excimer laser, as well as an optical system for directing the light from the light source to the reticle 1. This optical system may comprise an optical integrator such as disclosed in U.S. Pat. No. 4,497,013 assigned to the same assignee of the subject application, which integrator can function to illuminate the reticle 1 surface with uniform illuminance.

Light source device 5 operates to project a light beam inclinedly to the wafer 3, from between the projection lens system 2 and the wafer 3, as illustrated. The light reflected at this time inclinedly from the wafer 3 surface is extracted from between the projection lens system 2 and the wafer 3 and is received by a position sensor 6. The position sensor 6 produces an output signal which is changeable in accordance with the position of incidence of the reflected light upon a light receiving surface thereof. The light source device 5 and the position sensor 6 of the present embodiment cooperate to provide a detecting system for detecting the surface position of the wafer 3 in the Z direction. The surface position detecting system of the present embodiment may comprise a specific arrangement as disclosed in Japanese Laid-Open Patent Application, Laid-Open No. Sho62-140418. However, this is not restrictive but any other arrangement such as disclosed in U.S. Pat. Nos. 4,558,949, 4,395,117 and 4,600,282, for example, may be used.

Piezoelectric device 7 is provided in the wafer stage 4 and forms a driving mechanism for moving the wafer stage 4 in the Z direction along the optical axis of the projection lens system. This Z-axis driving mechanism is controlled by a controller 8 and the driving system 9, with the controller 8 processing the outputs of the surface position detecting system described above. Thus, the Z-axis driving mechanism operates to move the wafer 3 in the Z direction so as to place the wafer 3 just upon the focal surface of the projection lens system 2.

There is provided an alignment mark position detecting system 11 which functions to detect the positional relation between an alignment mark on the reticle 1 and an alignment mark on the wafer 3. This detecting system comprises a laser light source (not shown) and a photodetector (not shown). The laser beam emanating from the laser light source irradiates a mirror 12, the reticle 1, the projection lens system 2 and the wafer 3 in the named order and, at the same time, scans the alignment marks of the reticle 1 and the wafer 3. The reflectively diffracted light from the alignment mark of the reticle 1 and the reflectively diffracted light from the alignment mark of the wafer 3, both caused at that time, is detected by the photodetector (not shown) with the aid of the projection lens system 2 and the mirror 12. The output signals of the photodetector are processed by the controller 8, whereby, on the basis of calculations, any relative positional deviation (comprising components $\Delta X$, $\Delta Y$ and $\Delta \theta$) between the reticle 1 and the wafer 3 with respect to the X, Y and $\theta$ directions is detected. On the basis of the thus detected positional deviation, the driving system 9 operates to displace the wafer stage 4 in the X, Y and $\theta$ directions to thereby align the reticle 1 and the wafer 3 with each other.

While only one set of an alignment mark position detecting system is illustrated at 11 in the drawing, actually the alignment system of the present embodiment includes another set of alignment mark position detecting system which is disposed symmetrically with the illustrated alignment mark position detecting system, with respect to the optical axis AX of the projection lens system 2.

The alignment mark position detecting system 11 may comprise a specific arrangement such as disclosed in, for example, the aforementioned U.S. Pat. Nos. 4,251,129 and 4,406,546.

As discussed in these patents, a quarter waveplate may be provided within the projection lens system 2 of the present embodiment while, on the other hand, a laser beam from the unshown laser light source may comprise a particular linearly polarized light. By doing so, and when the reticle 1 and the wafer 3 are irradiated with such a laser beam, the light reflected from the reticle 1 and the light reflected from the wafer 3 can be separated from each other so that they can be detected by separate detecting systems.

The alignment mark position detecting system 11 of the present embodiment utilizes what is called a "dark-field detection method" wherein diffraction light caused by an alignment mark of a reticle or a wafer is detected, as described hereinbefore. However, this is not restrictive. For example, a detection method wherein an image of an alignment mark of a reticle or a wafer is picked up by use of an image pickup device, such as a TV camera or otherwise, may be used.

When, in operation of the alignment system of the present embodiment, any relative positional deviation between a reticle 1 and a wafer 3 is going to be detected, the wafer stage 4 is displaced in the direction of the optical axis AX of the projection lens system 2 (i.e. in the Z-axis direction) by a certain or predetermined amount $\Delta Z$, while taking the focus position of the projection lens system 2 as a reference position. Namely, the interval (relative distance) between the reticle 1 and the wafer 3 is enlarged or reduced by an amount $\Delta Z$. During such displacement, the position detecting operation by use of the alignment mark position detecting system 11 with regard to the alignment marks of the reticle 1 and the wafer 3 is repeatedly carried out through N cycles. More particularly, such repeated position detecting operations are executed at uniform or regular intervals, within the range of the displacement $\Delta Z$ of the wafer stage 4. To assure this, an autofocusing mechanism which comprises the surface position detecting system (namely, the light source 5, the position sensor 6, the piezoelectric device 7, the controller 8 and the driving system 9) operates to control the position of the wafer stage 4 during the repeated position detecting operations.

More specifically, one cycle of position detecting operation is made at a displacement $\Delta Z/N$ from the focus position of the projection lens system 2; a second cycle of the position detecting operation is made at a displacement $2\Delta Z/N$. In this manner, until the end of the displacement $\Delta Z$, the positional relation (deviation) between the alignment marks of the reticle 1 and the wafer 3 is measured repeatedly at different positions of the wafer stage 4. The measured values are sequentially and successively stored into a memory (not shown) within the controller 8. Then, the controller 8 operates to calculate an average of the measured values, obtained by the N cycles of position detecting operations, to thereby determine the positional relation between the alignment marks of the reticle 1 and the wafer 3. By this, relative positional deviation ($\Delta X$, $\Delta Y$ and $\Delta \theta$) between the reticle 1 and the wafer 3 is determined and, on the basis of this, the driving system 9 actuates to adjust the position of the wafer stage 4.

The alignment system of the present embodiment is set so as to satisfy the following relation, where the wavelength of the single-wavelength laser beam from the alignment mark position detecting system 11 is denoted by $\lambda$ and the amount of displacement of the wafer stage 4 is denoted by $\Delta Z$, as described above:

$$\Delta Z = n(\lambda/2)$$

wherein $n = 1, 2, 3, \ldots$

Particulars will be described while taking an example where $\Delta Z = \lambda/2$.

As described hereinbefore, the change in the state of interference fringe upon the light receiving surface of a photodetector, which change is a cause of the incorrect detection of the alignment mark position, results from the change in the difference, in the optical path length, between the light reflected once by a wafer and a multireflected light from the wafer.

Usually, it is not possible to maintain the wafer stage 4 and the reticle 1 completely stationary, and the relative distance between the reticle and the wafer is continuously changing by a minute amount. Accordingly, the optical path difference which determines the state of the interference fringe is also changing.

Even where the interval between the reticle 1 and the wafer 3 is set at such distance that satisfies the optimum exposure conditions, there is no assurance that exactly the same distance is maintained at each of different sites of different shot areas on a wafer 3 if the wafer is used in a stepper by which the different shot areas thereof are exposed sequentially. This is because of the possible effect of the flatness of the wafer. Additionally, due to the variation in pressure or temperature, it is difficult to assure that a reticle 1 and a wafer 3 are continuously retained exactly at the same distance or interval. As a result, the state of the interference fringe is not constant but variable.

In accordance with the alignment system of the present embodiment, in consideration thereof, the state of the interference fringe is positively changed so as to allow that the relative position of a reticle and a wafer is measured continually under the same interference condition. The principle is as follows:

Assuming now that a signal light $W_i$ (a light reflected by "i" times) and a signal light $W_{i+1}$ (a light reflected by "i+1" times), such as the aforementioned signal light W1 and the signal light W2, in an occasion where a reticle 1 and a wafer 3 are placed at an interval that satisfies the optimum exposure condition, have an optical path difference $\Delta l$ and if the interval (optical path length) between the reticle and the wafer is enlarged by an amount $\Delta Z = \lambda/2$, then the difference in the optical path length between the signal light $W_i$ and the signal light $W_{i+1}$ becomes equal to $\Delta l'$ ($= \Delta l + \lambda$). Thus, the state of the interference fringe is substantially the same as that established under the initially set condition. From this, it is seen that the state of interference fringe upon the light receiving surface of the photodetector, where it is considered as a periodic function, approximates to a function having a period of $\Delta Z = \lambda/2$.

Actually, while changing the interval between a reticle 1 and a wafer 3 at a predetermined pitch, during one cycle of that periodicity, the measurement was made by N times ($N \geq 2$) and an average of the measured values was obtained to determine the relative positional deviation $\Delta X$ between the reticle 1 and the wafer 3. From the results, it has been confirmed that the detected deviation $\Delta X$ constantly corresponds to a numerical value which can be obtained by measurement where the state of interference fringe is maintained constant. Also, it has been confirmed that the measured value changes periodically substantially along a sine curve, with a cycle $\lambda/2$.

As described hereinbefore, the present embodiment utilizes the phenomenon of a sine curve change in the measured value which the inventors of the subject application have first found. More specifically, the wafer stage 4 is displaced by an amount $\Delta Z$ ($= \lambda/2$) and, within this range of $\Delta Z = \lambda/2$, the displacement is uniformly divided into portions of a number N so that the measurement is repeatedly carried out through N cycles and, thereafter, an average of measured values is determined. By doing so, the relative positional deviation $\Delta X$ between the reticle and the wafer can be accurately detected, independently of the state of the interference fringe at the time prior to the initiation of the displacement of the wafer stage 4.

By selecting, as the displacement $\Delta Z$ (the amount of change in the optical path length), such a value that is within the range of the depth of focus of the alignment mark position detecting system, there is no possibility of deterioration in the mark position detecting accuracy due to the displacement of the stage.

Also, where the displacement $\Delta Z$ of the wafer stage 4 is set to satisfy "$\Delta Z = n(\lambda/2)$" and the number N of the measurement cycles is suitably set to satisfy "$N > n$", the positional deviation $\Delta X$ between the reticle 1 and the wafer 3 can be detected at higher precision.

Further, the relationship between the speed of displacement of the wafer stage 4 and the timing of measurement by the alignment mark position detecting system 11 may be determined, for example, in the following manner:

Assuming now that, with a particular shot area on a wafer 3, the wafer 3 and a reticle 1 are set at an optimum interval by which the wafer 3 is placed at the focus position of a projection lens system 1 and if the wafer stage 4 is thereafter to be displaced upwardly or downwardly at a constant speed V through a distance $\Delta Z = n(\lambda/2)$, then the actuation of the piezoelectric device for the movement of the wafer stage 4 may be controlled so that the speed V satisfies the following relation:

$$V = n(\lambda/2)(1/N\Delta t)$$

wherein N is the number of measurements and $\Delta t$ is a required time interval between successive measurements. By controlling the displacement while monitoring the position of the wafer 3 by use of the above-described autofocusing mechanism, the measurements of the number N can be made exactly. Accordingly, high-accuracy alignment is attainable.

One important feature of the present invention lies in the detection of an alignment mark while changing the interval between a reticle and a wafer. Within this scope of the present invention, the described embdiment may be modified in various ways. For example, the displacement of the wafer stage 4 in the described embodiment may be replaced by displacement of the reticle stage 12 in the direction of the optical axis or, alternatively, may be replaced by the combination of the reticle stage 12 displacement and the wafer stage 4 displacement. Substantially the same effect is attainable in these cases.

Further, the foregoing description has been made to a case where measurements of a number N are made while moving the wafer stage 4 at a constant speed, this is not restrictive. A possible alternative is that a measured value $X_1$ obtained at a certain reticle-to-wafer interval and another measured value $X_2$ obtained at another reticle-to-wafer interval which is established upon completion of the displacement of the reticle or wafer through a distance $\Delta Z = P\lambda/4$ (where P is an odd number), are averaged to determine the positional deviation $\Delta X$ between the reticle and the wafer. Even by doing so, the deviation can be correctly measured, independently of the state of interference fringe. Accordingly, high-accuracy alignment is attainable, also in this case.

Moreover, it is not always necessary to change the reticle-to-wafer interval at a constant speed by the constant-speed movement of the wafer stage 4 or otherwise. Namely, for example, while monitoring the current position of the wafer stage 4 by use of the above-described autofocusing mechanism and by controlling the displacement of the wafer stage 4, an "m-th" measurement among the measurements of a number N (wherein $N > m$) may be executed at the displacement of $m(\Delta Z/N)$.

In accordance with the present invention, as has hitherto been described, the positional relation between a first object such as a reticle or photomask and a second object such as a wafer is detected by repeatedly executing the measurement of the position of alignment marks while changing the interval (optical path length) between the first and second objects. By doing so, the positional relation (deviation) between the alignment marks of the first and second objects can be measured accurately, without being affected by multireflection of light caused between the first and second objects. Accordingly, the first and second objects can be aligned very accurately.

While the invention has been described with reference to the structures disclosed herein, it is not confined to the details set forth and this application is intended to cover such modifications or changes as may come within the purposes of the improvements or the scope of the following claims.

What is claimed is:

1. An alignment system for aligning a first object having a first alignment mark and a second object having a second alignment mark, the second object being disposed at a position which is approximately conjugate with the first object with respect to a projection optical system, said alignment system comprising:
   a detecting device for irradiating the first and second objects with light and for receiving the light from the irradiated first and second objects to detect the first and second alignment marks, wherein said detecting device receives the light from the second object as passed through the projection optical system and the first object;
   an adjusting device for adjusting a spacing between the first object and the second object in a direction along an optical axis of the projection optical system, said adjusting device being arranged and constructed to change the optical path length for the light from the second object, by adjusting the spacing between the first and second objects; and
   a control device for controlling said adjusting device, said control device being operable to control said adjusting device to set the spacing first to a first distance and then to a second distance different from the first distance, by controlling the spacing between the first and second objects in the direction of the optical axis of the projection optical system such that said detecting device produces a first signal corresponding to the first and second alignment marks at the first distance, and a second signal corresponding to the first and second alignment marks at the second distance, wherein said control device is operable to determine a positional deviation between the first and second objects on the basis of the first and second signals.

2. An alignment system according to claim 1, wherein said detecting device comprises a laser which supplies the light for irradiating the first and second objects.

3. An alignment system according to claim 2, wherein said control device controls said adjusting device to set the first and second distances such that a difference Z between the first and second distances is equal to $P \times \lambda/4$, where $\lambda$ is the wavelength of the light and P is a predetermined odd integer.

4. An alignment system according to claim 2, wherein said adjusting device includes:
   a movable stage for carrying the second object;
   a driving mechanism for moving said stage in the direction along the optical axis of the projection optical system and along a plane substantially perpendicular to the optical axis; and
   a detector for optically detecting the position of a surface of the second object in the direction along the optical axis of the projection optical system,
   wherein said control device cooperates with said detector and controls said driving mechanism to move said stage in the direction along the optical axis of the projection optical system while detecting the position of the surface of the second object, and
   wherein said control device controls said driving mechanism, on the basis of the first and second signals, to move said stage along the plane to align the second object with the first object.

5. An alignment system according to claim 4, wherein said control device is operable to cause said detecting device to produce the first and second signals without stopping movement of said stage in the direction along the optical axis.

6. An alignment system according to claim 2, wherein said detecting device includes a photodetector for photoelectrically converting, in a dark field, diffraction light produced at the first and second alignment marks, and wherein the first and second signals are outputted from said photodetector.

7. An alignment system according to claim 2, wherein said control device comprises an image pickup device for taking images of the first and second alignment marks, and wherein the first and second signals are outputted from said image pickup device.

8. An alignment device system according to claim 2, wherein the projection optical system is substantially telecentric both on the first object side and on the second object side.

9. An alignment system according to claim 1, wherein said control device controls said adjusting device to correct for the positional deviation between the first and second objects.

10. An alignment system according to claim 1, wherein the light from the second object as received by said detecting device comprises light reflected once by the second object and light reflected a plurality of times by the second object.

11. A method of aligning a first object having a first alignment mark and a second object having a second alignment mark, said method comprising:
    irradiating the first and second objects with a radiation beam;
    receiving the beam radiated from the first and second objects, the beam radiated from the second object being received after it passes the first object;
    detecting any relative positional deviation between the first and second objects by setting the length of a path for the radiation beam between the first and second objects to a first length and receiving the beam radiated from the first and second objects to produce a first signal corresponding to the first and second alignment marks, setting the length of the path for the radiation beam between the first and second objects to a second length, different from the first length, and receiving the beam radiated from the first and second objects to produce a second signal corresponding to the first and second alignment marks, and determining the positional deviation between the first and second objects on the basis of the first and second signals; and
    adjusting the relative position of the first and second objects on the basis of the determination.

12. A method according to claim 11, wherein the step of irradiating includes irradiating the first and second objects with a coherent radiation beam.

13. A method according to claim 12, wherein during the irradiating step, the detecting step and the adjusting step, the first and second objects are positioned in a substantially conjugate relationship with respect to a predetermined optical system.

14. A method according to claim 13, wherein the predetermined optical system is telecentric on the first object side and on the second object side.

15. A method according to claim 13, wherein the first and second signals are produced on the basis of photoelectric conversion in a dark field, of diffraction light from the first and second alignment marks.

16. A method according to claim 13, wherein the first and second signals are produced on the basis of image pickup made to the first and second alignment marks.

17. A method according to claim 12, wherein during the production of each of the first and second signals, the length of path for the radiation beam is set by changing the distance between the first and second objects.

18. A method according claim 12, wherein the setting of the length of path for the radiation beam to the first and second lengths is made successively.

19. A method according to claim 12, wherein a difference between the first and second lengths of the path of the radiation beam is equal (P×λ/4), where λ is the wavelength of the radiation beam and P is a predetermined odd integer.

20. A method according to claim 12, wherein the step for determining the positional deviation between the first and second objects includes forming first data related to a positional deviation between the first and second alignment marks on the basis of the first signal, forming second data related to a positional deviation between the first and second alignment marks on the basis of the second signal, and detecting the positional deviation between the first and second objects by processing the first and second data.

21. A method according to claim 11, wherein said receiving step comprises the step of receiving a beam reflected once by the second object and receiving another beam reflected a plurality of times by the second object.

22. A position detecting device for detecting the position of an alignment mark provided on a wafer, said device comprising:
a movable stage on which the wafer may be placed;
irradiating means for irradiating a wafer, placed on said movable stage, with a radiation beam;
detecting means having a beam detector for receiving a beam reflected from the irradiated wafer and for producing a signal corresponding to the alignment mark on the wafer; and
adjusting and determining means for adjusting the length of the path of the beam reflected from the wafer to a first length and then to a second length, different from the first length, such that said beam detector produces a first signal corresponding to the alignment mark when the length of the path of the beam reflected from the wafer is adjusted to the first length and produces a second signal corresponding to the alignment mark when the length of the path of the beam reflected from the wafer is adjusted to the second length, wherein said adjusting and determining means determines the position of the alignment mark on the wafer on the basis of the first and second signals.

23. A device according to claim 22, wherein said irradiating means irradiates the wafer with a coherent radiation beam.

24. A device according to claim 23, wherein said irradiating means supplies a laser beam as the radiation beam.

25. A device according to claim 24, wherein said adjusting and determining means includes a driving system for moving said movable stage in a direction substantially perpendicular to the surface of the wafer to adjust the length of the path of the beam reflected from the wafer.

26. A device according to claim 25, wherein said irradiating means and said detecting means have a common projection lens system for projecting an image of a pattern on the wafer and wherein, through said projection lens system, the radiation beam is directed to the wafer and the reflected beam is directed to said beam detector.

27. A device according to claim 26, wherein said adjusting and determining means prepares a plurality of data related to the alignment mark by using a plurality of signals from said beam detector including the first and second signals and wherein said adjusting and determining means determines the position of the alignment mark by averaging said plurality of data.

28. A device according to claim 22, wherein said detecting means receives a beam reflected once by the wafer and another beam reflected a plurality of times by the wafer.

29. A system for detecting the positional deviation between a first object having a first alignment mark and a second object having a second alignment mark, wherein the first and second objects are disposed in an approximately conjugate relationship with each other with respect to a projection optical system, said system comprising:
a detecting device for irradiating the first and second objects with light and for receiving the light from the irradiated first and second objects to detect the first and second alignment marks, wherein said detecting device receives the light from the second object as passed through the projection optical system and the first object and wherein the light from the second object as received by said detecting device comprises first light reflected once by the second object and second light reflected a plurality of times by the second object;
an adjusting device for adjusting the spacing between the first and second objects in a direction along an optical axis of the projection optical system, to change the optical path length for the light from the second object; and
a control device for controlling said adjusting device to set the spacing first to a first distance and then to a second distance different from the first distance so as to provide different conditions for interference between the first light and the second light;
wherein said detecting device produces a first signal corresponding to the first and second alignment marks at the first distance and a second signal corresponding to the first and second alignment marks at the second distance; and
wherein said control device determines the relative position of the first and second objects on the basis of the first and second signals.

30. A system according to claim 29, wherein said control means comprises means for determining the relative position of the first and second objects based on the first and second signals substantially free from an error attributable to interference between the first and second lights.

31. A method of detecting the positional deviation between a first object having a first alignment mark and a second object having a second alignment mark, said method comprising the steps of:
irradiating the first and second objects with a radiation beam;
receiving a beam radiated from the first and second objects, wherein the beam radiated from the second object is received after passing through the first object and wherein the beam radiated from the second object as received comprises a first beam reflected once by the second object and a second beam reflected a plurality of times by the second object;

setting, for the reception of the beam radiated from the first and second objects, the length of a path for the radiation beam between the first and second objects to a first length to provide a first condition for interference between the first and second beams, such that, in response to the reception of the beam radiated from the first and second objects, a first signal corresponding to the first and second alignment marks at the first path length is produced;

setting, for the reception of the beam radiated from the first and second objects, the length of the path for the radiation beam between the first and second objects to a second length different from the first length to provide a second condition for interference between the first and second beams different from the first condition, such that, in response to the reception the beam radiation from the first and second objects, a second signal corresponding to the first and second alignment marks at the second path length is produced; and determining the relative position of the first and second objects on the basis of the first and second signals.

32. A method according to claim 31, wherein said determining step comprises the step of determining the relative position of the first and second objects based on the first and second signals substantially free from an error attributable to interference between the first and second beams.

33. An alignment and exposure apparatus including a projection optical system, wherein a mask having a first alignment mark and a circuit pattern and a wafer having a second alignment mark are disposed in an optically conjugate relationship, wherein any positional deviation between the mask and the wafer is detected and wherein, after correction of the positional deviation, the circuit pattern of the mask is projected onto the wafer through said projection optical system, said apparatus comprising:

a first stage for supporting the mask;

a second stage being movable and for supporting the wafer;

illumination means for illuminating the mask for the projection of the circuit pattern therefrom;

detecting means for projecting light to the mask and the wafer and for receiving light from the mask and the wafer, to detect the first and second alignment marks carried on each, wherein said detecting means is adapted to receive light from the wafer coming thereto through said projection optical system and through the mask and wherein the light received by said detecting means includes a first light reflected once by the wafer and a second light reflected at least two times by the wafer;

driving means for moving said second stage to adjust the position of the wafer with respect to a first direction along the optical axis of said projection optical system and a second direction perpendicular to the optical axis of said projection optical system, wherein the adjustment in said first direction causes a change in optical path length for the light from the wafer;

control means for controlling said driving means;

wherein said control means is adapted to control the drive of said second stage in said first direction so as to set the interval between the mask and the wafer first to a first distance and second to a second distance different from the first distance, thereby to provide conditions which are different from each other with respect to the interference of the first and second lights, and said detecting means is adapted to produce a first signal corresponding to the first and second alignment marks at the first distance and to produce a second signal corresponding to the first and second alignment marks at the second distance; and wherein said control means is further adapted to detect a positional deviation of the wafer from the mask in said second direction by using the first and second signals and to control the drive of said second stage in said second direction in accordance with the detected positional deviation thereby to align the wafer with respect to the mask.

34. A semiconductor device manufacturing method wherein a positional deviation of a mask and a wafer is detected by using first and second alignment marks carried respectively on the mask and the wafer, and wherein, after the positional deviation is corrected, a circuit pattern of the mask is projected onto the wafer thereby to print the circuit pattern on the wafer, said method comprising the steps of:

irradiating the mask and the wafer with a radiation beam;

receiving a beam radiated from the mask and the wafer, wherein the beam radiated from the wafer is received after passing through the mask and wherein the beam radiated from the wafer as received comprises a first beam reflected once by the wafer and a second beam reflected a plurality of times by the wafer;

setting, for the reception of the beam radiated from the mask and the wafer, the length of a path for the radiation beam between the mask and the wafer to a first length to provide a first condition for interference between the first and second beams, such that, in response to the reception of the beam radiated from the mask and the wafer, a first signal corresponding to the first and second alignment marks at the first path length is produced;

setting, for the reception of the beam radiated from the mask and the wafer, the length of the path for the radiation beam between the mask and the wafer to a second length different from the first length to provide a second condition for interference between the first and second beams different from the first condition, such that, in response to the reception the beam radiated from the mask and the wafer, a second signal corresponding to the first and second alignment marks at the second path length is produced; and detecting the positional deviation between the mask and the wafer on the basis of the first and second signals.

35. An alignment system for aligning a first object having a first alignment mark and a second object having a second alignment mark, said alignment system comprising:

a detecting device for irradiating the first and second objects with light and for receiving the light from the irradiated first and second objects to detect the first and second alignment marks, wherein said detecting device receives the light from the second object as passed through the first object;

an adjusting device for adjusting a spacing between the first object and the second object, said adjusting device being arranged and constructed to change the optical path length for the light from the second object, by adjusting the spacing between the first and second objects; and a control device for controlling said adjusting device, said control device being operable to control said adjusting device to set the spacing first to a first distance and then to a second distance different from the first distance, by controlling the spacing between the first and second objects such that said detecting device produces a first signal corresponding to the first and second alignment marks at the first distance, and a second signal corresponding to the first and second alignment marks at the second distance, wherein said control device is operable to determine a positional deviation between the first and second objects on the basis of the first and second signals.

* * * * *

UNITED STATES PATENT AND TRADEMARK OFFICE
CERTIFICATE OF CORRECTION

PATENT NO. : 5,166,754          Page 1 of 2
DATED      : November 24, 1992
INVENTOR(S) : AKIYOSHI SUZUKI, ET AL.

It is certified that error appears in the above-identified patent and that said Letters Patent is hereby corrected as shown below:

On the title page,
[30] FOREIGN APPLICATION PRIORITY DATA

"Jul. 3, 1987 [JP] Japan 62-16547" should read --Jul. 3, 1987 [JP] Japan 62-165471--.

[57] ABSTRACT

Line 2, "object" should read --object,--.
Line 7, delete "with light".
Line 10, "objects" should read --object--.
Line 17, "ing, control device controls the adjusting device." should read --ing.--.

COLUMN 10

Line 67, "field," should read --field--.

COLUMN 13

Line 22, "radiation" should read --radiated--.

UNITED STATES PATENT AND TRADEMARK OFFICE
CERTIFICATE OF CORRECTION

PATENT NO. : 5,166,754

DATED : November 24, 1992

INVENTOR(S) : AKIYOSHI SUZUKI, ET AL.

It is certified that error appears in the above-identified patent and that said Letters Patent is hereby corrected as shown below:

<u>IN FIG 1</u>

In Box 11, "SYSTEN" should read --SYSTEM--.

Signed and Sealed this

Seventh Day of December, 1993

Attest:

BRUCE LEHMAN

Attesting Officer

Commissioner of Patents and Trademarks